(12) United States Patent
Kulyk

(10) Patent No.: US 9,321,027 B2
(45) Date of Patent: Apr. 26, 2016

(54) MACHINE AND METHOD FOR ATMOSPHERIC PLASMA TREATMENT OF CONTINUOUS SUBSTRATES

(75) Inventor: Illya Kulyk, Padua (IT)

(73) Assignee: VENETO NANOTECH S.C.P.A. (IT)

( * ) Notice: Subject to any disclaimer, the term of this patent is extended or adjusted under 35 U.S.C. 154(b) by 690 days.

(21) Appl. No.: 13/519,446

(22) PCT Filed: Jan. 31, 2011

(86) PCT No.: PCT/IB2011/050417
§ 371 (c)(1),
(2), (4) Date: Jun. 27, 2012

(87) PCT Pub. No.: WO2011/095930
PCT Pub. Date: Aug. 11, 2011

(65) Prior Publication Data
US 2012/0295036 A1    Nov. 22, 2012

(30) Foreign Application Priority Data

Feb. 2, 2010    (IT) ............................... BO2010A0058

(51) Int. Cl.
*B01J 19/08*    (2006.01)
*H01J 37/00*    (2006.01)
(Continued)

(52) U.S. Cl.
CPC ............ *B01J 19/088* (2013.01); *B05D 3/141* (2013.01); *C23C 16/50* (2013.01); *D06B 19/00* (2013.01);
(Continued)

(58) Field of Classification Search
CPC ............ D06M 10/025; H01J 37/3277; H01J 37/32825; B01J 19/088; H05H 1/24

USPC .......................................... 118/620; 427/525
See application file for complete search history.

(56) References Cited

U.S. PATENT DOCUMENTS 3,369,981 A * 2/1968 Levaux ..................... 204/165
3,674,667 A * 7/1972 Manion et al. ............. 204/165
(Continued)

FOREIGN PATENT DOCUMENTS

DE    28 36 867    3/1980
DE    31 15 958    12/1982
(Continued)

OTHER PUBLICATIONS

Martin, Peter M.. (2010). Handbook of Deposition Technologies for Films and Coatings—Science, Applications and Technology (3rd Edition). William Andrew Publishing. Online version available at: http://app.knovel.com/hotlink/toc/id:kpHDTFCSA1/handbook-deposition-technologies/handbook-deposition-technologies.*

(Continued)

*Primary Examiner* — Dah-Wei D Yuan
*Assistant Examiner* — Jose Hernandez-Diaz
(74) *Attorney, Agent, or Firm* — Timothy J. Klima; Shuttleworth & Ingersoll, PLC

(57) ABSTRACT

A machine for atmospheric plasma treatment of continuous material substrates comprises means for feeding a substrate for moving it along a feed path; at least two electrodes each positioned at one face of the substrate, each electrode facing a respective face of the substrate, a difference in electric potential being applicable across the electrodes for generating an electric discharge; the feed means comprising at least one first roller and one second roller, the first roller and the second roller coinciding with respective electrodes and each acting on a respective face of the substrate.

7 Claims, 2 Drawing Sheets

(51) Int. Cl.
*C23C 16/50* (2006.01)
*B05D 3/14* (2006.01)
*D06M 10/02* (2006.01)
*H01J 37/32* (2006.01)
*D06B 19/00* (2006.01)
*H05H 1/48* (2006.01)
*B29C 59/14* (2006.01)

(52) U.S. Cl.
CPC .......... *D06M 10/025* (2013.01); *H01J 37/3277* (2013.01); *H01J 37/32825* (2013.01); *H05H 1/48* (2013.01); *B01J 2219/083* (2013.01); *B01J 2219/0809* (2013.01); *B01J 2219/0818* (2013.01); *B01J 2219/0879* (2013.01); *B01J 2219/0896* (2013.01); *B05D 3/148* (2013.01); *B29C 59/14* (2013.01); *H05H 2001/485* (2013.01)

(56) References Cited

U.S. PATENT DOCUMENTS

| | | | |
|---|---|---|---|
| 3,959,104 A * | 5/1976 | Fales | 204/164 |
| 2008/0118734 A1* | 5/2008 | Goodwin et al. | 428/221 |

FOREIGN PATENT DOCUMENTS

| | | |
|---|---|---|
| WO | 95/12697 | 5/1995 |
| WO | 2009/104957 | 8/2009 |
| WO | WO 2009104957 A1 * | 8/2009 |

OTHER PUBLICATIONS

International Search Report and Written Opinion dated Jun. 8, 2011 from counterpart application.

* cited by examiner

MACHINE AND METHOD FOR ATMOSPHERIC PLASMA TREATMENT OF CONTINUOUS SUBSTRATES

This application is the National Phase of International Application PCT/IB2011/050417 filed Jan. 31, 2011 which designated the U.S. and that International Application was published under PCT Article 21(2) in English.

This application claims priority to Italian Patent Application No. BO2010A000058 filed Feb. 2, 2010 and PCT Application No. PCT/IB2011/050417 filed Jan. 31, 2011, which applications are incorporated by reference herein.

TECHNICAL FIELD

This invention relates to a machine for atmospheric plasma treatment of substrates of permeable material in-line, that is to say, a machine able to treat substrates made of fabric, non-woven fabric, bands of fibres, reinforcement fabric (for example glass or carbon fibres) or other by means of ionised gas.

Plasma treatment allows substrates of permeable material with modified properties to be obtained. In particular, this treatment allows modification of properties of the material such as water repellence, absorption of colours and dyes, anti-felting properties (in the case of wool), and others. The plasma treatment also allows, on particular substrates such as non-woven fabric, material to be deposited on the substrate itself.

BACKGROUND ART

A prior art machine for plasma treatment of substrates of permeable material comprises a cylindrical hollow drum. The drum can rotate about its own central axis of rotation to convey the substrate to be processed. In particular, during machine operation the substrate partly covers an outer cylindrical surface of the drum.

The machine comprises a first electrode covering the outer cylindrical surface of the drum. In more detail, during machine operation the first electrode is interposed between the drum and the substrate.

The machine also comprises a second electrode facing the first and outside the drum. During machine operation the substrate to be processed is positioned between the first and second electrodes. In other words, the second electrode partly surrounds the drum.

The second electrode comprises a plurality of cylindrical bars each with its own main axis of extension parallel with the central axis of rotation of the drum. The bars are equidistant from the central axis of rotation of the drum. They are also spaced at equal angles to each other.

The cylindrical outer surface of the drum has openings allowing the passage of gas from the outside towards an inner cavity in the drum. The inner cavity is connected to a suction fan. During operation the suction fan forces the gas to move from the outside to the inside of the drum, thus creating a flow of gas between the bars of the second electrode and the first electrode. In particular, during operation said flow of gas passes through the substrate placed between the electrodes.

During operation there is a difference in electric potential across the two electrodes, which generates electric discharges between the bars of the second electrode and the first electrode. In this way, the gas travelling between the first and second electrodes is ionised, producing the plasma close to the substrate and allowing the substrate to be treated.

The prior art machine for plasma treatment of substrates of permeable material has significant disadvantages. First, the rotation of the drum subjects the substrate to tangential forces able to deform and pull apart low resistance materials (for example bands of fibres).

Another disadvantage is the different distances between substrate and the first and second electrodes. That results in uneven treatment on two faces of the substrate.

DISCLOSURE OF THE INVENTION

In this context, the technical purpose which forms the basis of this invention is to propose a machine for atmospheric plasma treatment of substrates of permeable material which overcomes the above mentioned disadvantages of the prior art.

In particular, the aim of this invention is to provide a machine for plasma treatment of substrates of permeable material which have low resistance to tangential forces.

The term low resistance or low density material refers to a permeable material with a loose and substantially irregular weave of preferably short fibres.

Another aim of this invention is to propose a machine and method for plasma treatment of substrates of permeable material able to guarantee equivalent properties on both faces of the material.

The technical purpose indicated and the aim specified are substantially achieved by a machine and method for plasma treatment of substrates of permeable material with the technical features described herein.

BRIEF DESCRIPTION OF THE DRAWINGS

Further features and advantages of this invention are more apparent from the non-limiting description which follows of a preferred, non-limiting embodiment of a machine and a method for plasma treatment of substrates of permeable material, as illustrated in the accompanying drawings, in which.

DETAILED DESCRIPTION OF THE PREFERRED EMBODIMENTS OF THE INVENTION

With reference to the accompanying drawings, the numeral 1 denotes in its entirety a machine for plasma treatment of substrates 3 of permeable material in accordance with this invention. For example, the substrate 3 may be made of fabric, non-woven fabric, reinforcement fabric (for example glass or carbon fibres), bands of fibres or the like.

Figure 1:
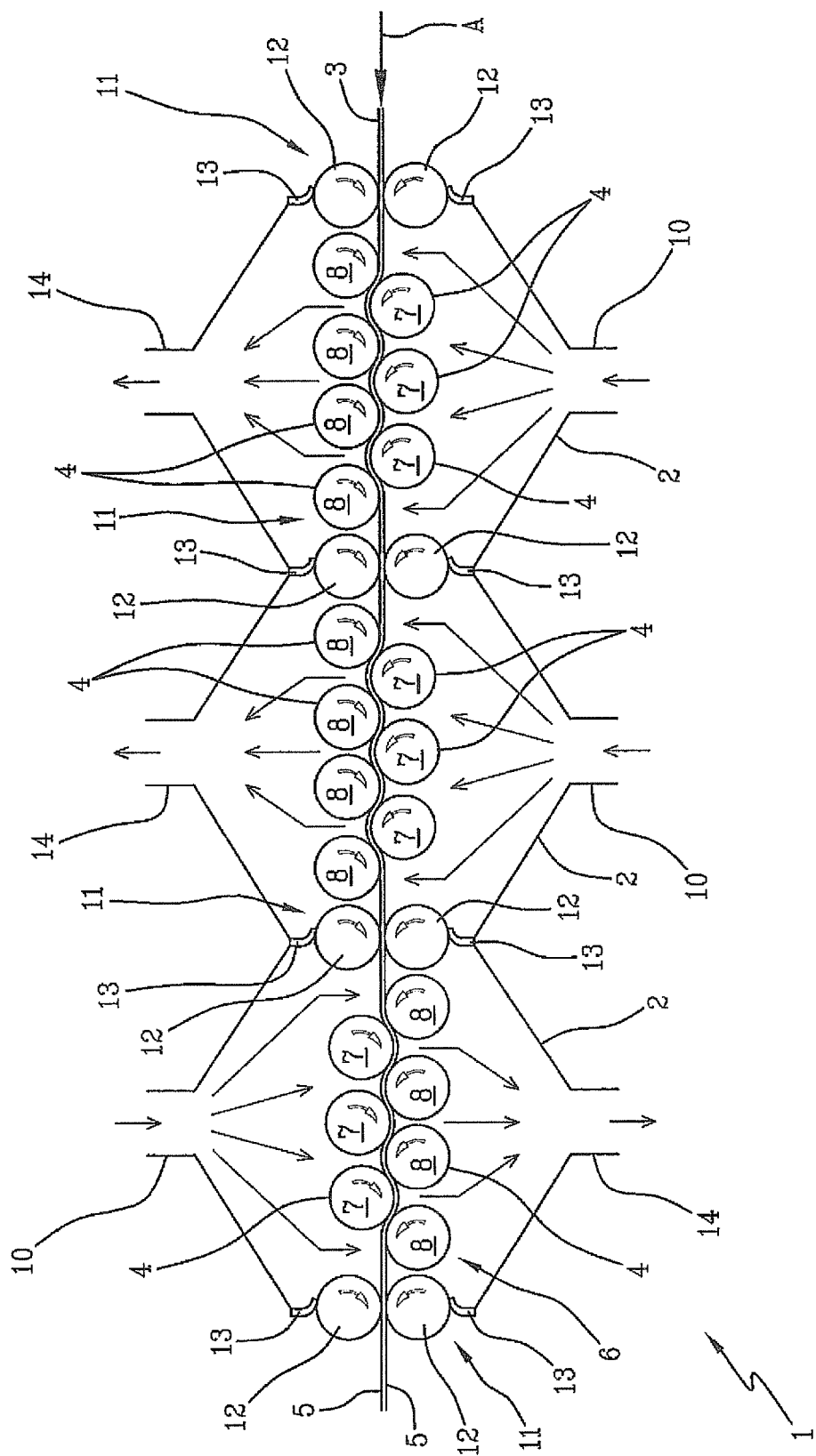
FIG. 1 is a schematic side view of a machine for plasma treatment of substrates of continuous material according to this invention.

The machine 1 comprises a frame in which at least one operating chamber 2 is formed for atmospheric plasma treatment of a substrate 3. The embodiment described preferably comprises a plurality of chambers 2 arranged in series. In particular with reference to FIG. 1, the machine 1 comprises three chambers 2.

The substrate 3 can be inserted in the chambers 2 to carry out the atmospheric plasma treatment. In practice, each chamber 2 accommodates the flow of gas, necessary for plasma production.

The main gas is preferably air, although the gas may be a mixture of main gas with any other special gas that can be used for plasma treatment of the substrate 3 to be processed, for example reactive gases (nitrogen, carbon dioxide or others of the precursor type), or inert gases (helium or others) or mixtures of them.

According to alternative embodiments, not illustrated, of the machine 1, at the zones hereinafter labelled treatment zones 9, the machine comprises respective means for localised blowing of special (precursor) gases.

For plasma production, the machine 1 comprises at least two electrodes 4, preferably inserted in each chamber 2. In particular, each electrode 4 is facing a respective face 5 of the substrate 3. In practice, a difference in electric potential is applied across the electrodes 4 to generate an electric discharge, which ionises the gas and produces the plasma close to the substrate 3 to be processed.

The machine 1 also comprises feed means 6 for the substrate 3, for moving the substrate 3 along a feed path A. In particular, the feed means 6 comprise at least one first roller 7 and one second roller 8, preferably housed in one of the chambers 2. Preferably, each chamber 2 houses a respective first roller 7 and a second roller 8.

The first roller 7 and the second roller 8 are in contact with respective opposite faces 5 of the substrate 3. In particular, the first roller 7 and the second roller 8 rotate in opposite directions, and preferably rotate at the same speed, in such a way that they apply an equal feed action on both faces 5 of the substrate 3.

The term "feed action" refers to the rollers 7, 8 accompanying the substrate due to the static friction which is created between the outer surface of the rollers and the substrate itself, without any pulling of the substrate 3 as it is fed along the path A.

In the embodiment described, the distance between the first roller 7 and the second roller 8 is advantageously less than a thickness of the substrate 3 to be processed. Said distance is preferably greater than 0.4 mm.

Figure 2:
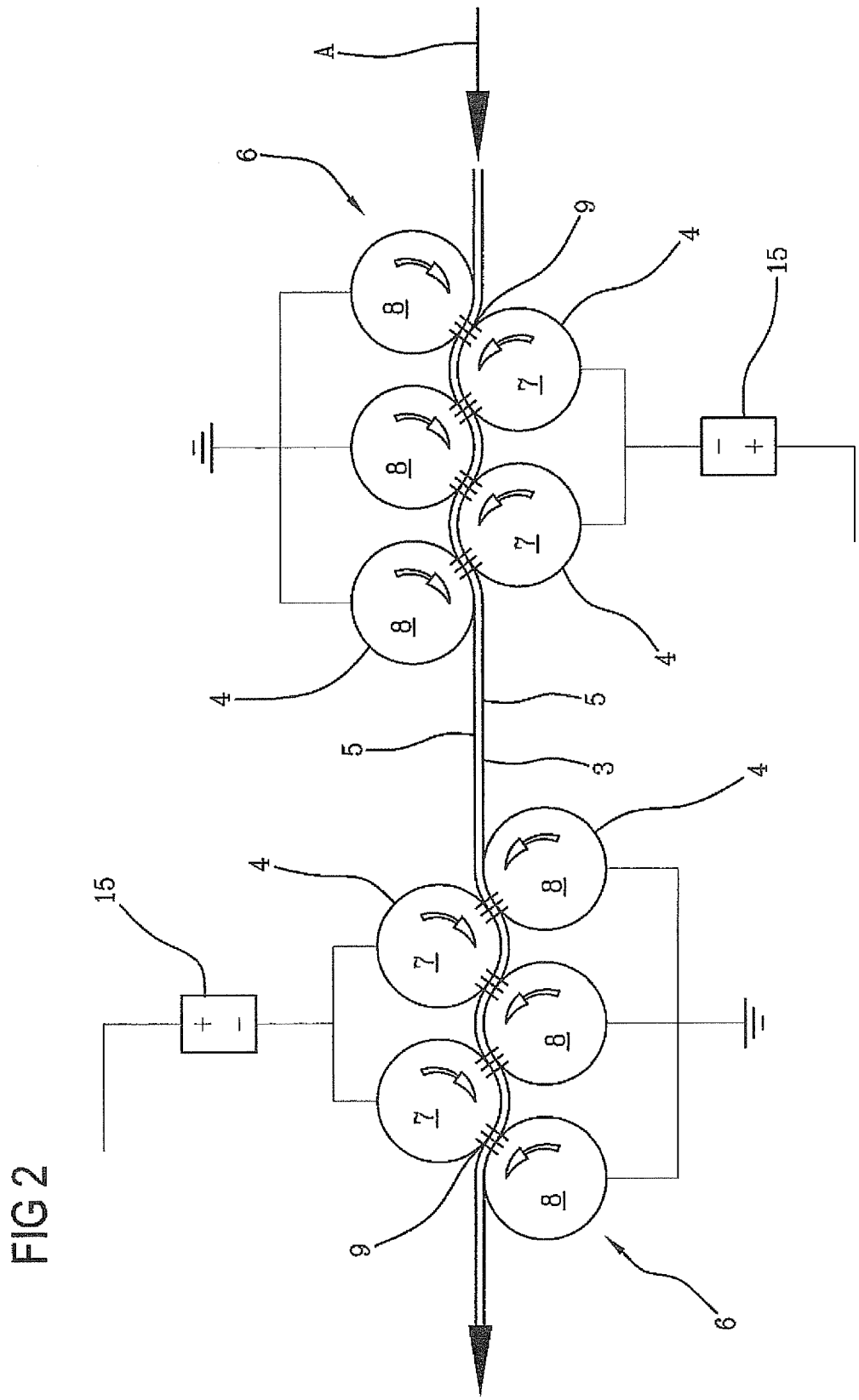
FIG. 2 is a schematic side view of a detail of the machine of FIG. 1.

Advantageously, the first roller 7 and the second roller 8 each coincide with a respective electrode 4. For this reason, the first roller 7 and the second roller 8 are coated on their outer cylindrical surface with a coating made of dielectric material, preferably silicone. In particular with reference to FIG. 2, to create the above-mentioned difference in potential across the first roller 7 and the second roller 8, the first roller 7 is connected to an electricity generator such as an alternator 15, and the second roller 8 is connected to the earth potential.

The first roller 7 and the second roller 8 each have a respective axis of rotation. The axes of rotation are preferably parallel with each other. Moreover, the axes of rotation are positioned perpendicular to the feed path A for the substrate 3.

In more detail, the first roller 7 and the second roller 8 are cylindrical. The first roller 7 and the second roller 8 also have identical diameters of between 50 and 90 mm, preferably 70 mm. The rollers 7, 8 are coated with a dielectric layer so that they can generate the discharge of the Dielectric Barrier Discharge (DBD) type.

In the embodiment described, the machine 1 comprises arrays of first rollers 7 and arrays of second rollers 8. Said arrays are preferably housed in the chambers 2.

Each array of first rollers 7 and of second rollers 8 operates on a respective face 5 of the substrate 3, in such a way as to generate the plasma at a plurality of discharge zones 9 which lie between each first roller 7 and second roller 8. The arrays also operate on the substrate 3 at a treatment zone. The treatment zone is formed by the combination of the discharge zones 9 present in a chamber 2.

The arrays also operate on the substrate 3 in conjunction with each other in such a way as to move the substrate 3 along the feed path A.

The machine 1 feed means 6 comprise at least one motor (not illustrated) acting on all of the first and second rollers 7, 8, driving their rotation. In other words, each first roller 7 and second roller 8 is motor-driven, and rotates at the same speed. Advantageously, this allows said feed action to be applied evenly on the substrate 3. In particular, the feed action is distributed evenly over the entire treatment zone, feeding the substrate 3 along the feed path A.

The axes of rotation of the first rollers 7 lie in a first reference plane and are preferably spaced equally. Similarly, the axes of rotation of the second rollers 8 lie in a second reference plane and are preferably spaced equally. The first and second reference planes are parallel with each other.

In the embodiment described, the distance between two axes of rotation of two adjacent first rollers 7 is between 100% and 150% of the diameter of the first roller 7. The distance is preferably between 120% and 130% of the diameter of the first roller 7. In the embodiment described, the distance between two axes of rotation of two adjacent second rollers 8 is between 100% and 150% of the diameter of the second roller 8. The distance is preferably between 120% and 130% of the diameter of the second roller 8.

Each first roller 7 is operatively positioned between two second rollers 8. In other words, a projection in an operating plane of the axis of rotation of each first roller 7 is between two projections of the axes of rotation of two second rollers 8.

The operating plane is a plane parallel with the first and second reference planes and equidistant from them.

In other words, in the layout described above the first rollers 7 and the second rollers 8 are offset from each other.

In particular, each projection in the operating plane of the axis of rotation of each first roller 7 is equidistant from two projections of the axes of rotation of two second rollers 8.

It should be noticed that the array of second rollers 8 comprises a number of second rollers 8 which is one more than the number of first roller 7 in the array of first rollers 7. For this reason, the first rollers 7 are placed further from the walls of the chamber 2 than the distance between the second rollers 8 and the walls of the chamber 2. Advantageously, this prevents electric discharges between the first rollers 7 and the walls of the chamber 2.

Each first roller 7 therefore faces two second rollers 8, forming two discharge zones 9 in which plasma is produced.

The machine 1 also comprises fan means for each chamber 2 for introducing a flow of the main gas, advantageously, air.

If there are blowing means for the specific gases and, advantageously, precursor gases, close to the discharge zones 9, the machine advantageously comprises a compressor (not illustrated) for injecting said gases into the blowing means.

Each chamber 2 has an opening 10 for infeed of the main gas. The opening 10 is preferably made in a wall of the chamber 2, and faces the array of first rollers 7 or the array of second rollers 8, for introducing the main gas towards one of the two arrays. In this way, the gas flows between the first rollers 7 and the second rollers 8 at the discharge zones 9.

Advantageously, the fan means comprise a conditioning unit, not illustrated in the accompanying drawings, for controlling the humidity of the air introduced into the chamber 2.

The fan means allow simultaneous cooling of the first rollers 7, of the second rollers 8 and of the substrate 3, helping to avoid burns on a portion of substrate 3 in contact with the first rollers 7 and the second rollers 8.

The flow of gases (air and/or other gases) caused by the fan means in the treatment zone also macroscopically evens out the plasma treatment on the material which makes up the substrate, thus avoiding burns on the material caused by repeated discharges located at the same point of the substrate.

Moreover, the flow of air generated by the fan means is useful for carrying away excess gases which form due to the interaction between the plasma and the substrate, which could cause unwanted changes to the electric discharge, making the treatment very uneven.

Each chamber 2 also comprises a further opening 14 for extraction of the gas. This opening is preferably located in another wall of the chamber 2 which is opposite the wall of the chamber 2 in which the opening 10 is made. Advantageously, this allows extraction of the gaseous products derived from ionisation of the gas.

In one embodiment, the plasma treatment does not take place in the first chamber 2. In other words, the first and second rollers 7, 8 in the first chamber 2 do not act as electrodes 4, but instead are only used for substrate 3 feed. In other words, in practice there are no discharges between the first rollers 7 and the second rollers 8 in the first chamber 2. This allows preparation of the substrate 3, immersing it in a gaseous environment without carrying out the plasma treatment in the first chamber 2. Alternatively, if said preparation is not necessary, the first rollers 7 and the second rollers 8 in the first chamber 2 act as electrodes 4, and the plasma treatment is carried out in all of the chambers 2.

The machine 1 comprises transfer means 11 acting on the substrate 3 and operatively positioned between the chambers 2, for moving the substrate 3 from one chamber 2 to another. In particular, the transfer means 11 comprise pairs of cylinders 12. The cylinders 12 have their own axes of rotation which are parallel with the axes of rotation of the first rollers 7 and the second rollers 8. In more detail, each cylinder 12 acts on one face 5 of the substrate 3, accompanying its movement along the feed path A. Each pair of cylinders 12 is operatively positioned between two chambers 2. In this way, each pair of cylinders 12 transfers the substrate 3 between two chambers 2 which are located one after another.

The machine 1 also comprises a plurality of seals 13, each positioned between a cylinder 12 and a chamber 2 to prevent exchanges of gas between the chambers 2. In the embodiment described, the seals 13 are sheets preferably made of elastomeric material.

A method for plasma treatment of substrates 3 of permeable material according to this invention comprises a step of feeding the substrate 3 along a feed path A.

The substrate 3 is preferably prepared by immersing the substrate 3 in an environment containing the gas which will subsequently be ionised.

Then, and simultaneously with the feed step, plasma is produced by triggering an electric discharge in an environment containing the above-mentioned gas. The plasma produced in this way is applied to the substrate 3 at the treatment zone.

In particular, the step of feeding the substrate 3 takes place by implementing a feed action (without any pulling on the substrate) in the treatment zone.

During processing, a flow of the above-mentioned gas to be ionised is produced and directed into the treatment zone.

In a preferred embodiment, the step of producing the flow of gas comprises the step of conditioning the gas, which is preferably air, before it is directed at the treatment zone.

The step of generating and applying plasma is advantageously repeated a plurality of times. In the embodiment described it is repeated twice.

Optionally, the type of gas and its conditioning can be varied with each repetition.

Optionally, it is possible to change the direction of flow of the gas in the chambers 2 with an opposite direction in one chamber compared with the other.

This invention achieves the preset aims and brings important advantages. The machine according to this invention comprises at least two rollers which, acting on both faces of the substrate, treat it evenly and prevent mechanical deterioration of the substrate.

Moreover, since the rollers are also electrodes, the processing is carried out evenly on the substrate.

Moreover, since the rollers subject the substrate to the treatment in the same way on both faces, said faces will have similar features.

The machine comprises two arrays of rollers in such a way as to distribute the action necessary for substrate feed along a portion of its length, thus noticeably reducing local tensions. This is particularly advantageously in the case of low density materials, which could otherwise be damaged.

Moreover, the machine according to this invention comprises fan means able to change the gas in the treatment zone and to simultaneously cool the substrate and the rollers, and therefore preventing burns on the substrate.

The first and second rollers 7, 8 perform a substrate 3 fixing action which guarantees that the air/gas flow passing through it does not cause the substrate 3 to break up or in any case deteriorate, unlike what happens in plasma treatment machines in which the substrate is suspended and then picked up again with a pulling action, and therefore easily exposed to deterioration.

The invention claimed is:

1. A method for atmospheric plasma treatment of continuous substrates, comprising:
   feeding a substrate along a feed path between an array of first rollers and an array of second rollers, the array of first and second rollers acting on the substrate in conjunction with each other for conveying the substrate along the feed path;
   applying a difference in electrical potential across the array of first rollers and the array of second rollers for generating an electrical discharge between the array of first rollers and the array of second rollers to apply an atmospheric plasma to the substrate in a treatment zone;
   wherein the feeding the substrate takes place by applying a feed action with the arrays of first and second rollers by driving the rotation of the arrays of first and second rollers with at least one motor separately from any action by substrate on the arrays of the first and second rollers, the feed action being distributed in the treatment zone;
   setting a minimum distance between first rollers of the array of first rollers and adjacent second rollers of the array of second rollers in the treatment zone to be less than a thickness of the substrate.

2. The method according to claim 1, and further comprising cooling the rollers during the treatment step.

3. The method according to claim 2, wherein the substrate is permeable, and further comprising directing a flow of gas at the treatment zone, to blow gas through the permeable substrate when the substrate is positioned in the treatment zone.

4. The method according to claim 3, and further comprising operatively positioning each first roller of the array of first rollers between two adjacent second rollers of the array of second rollers.

5. The method according to claim 1, and further comprising operatively positioning each first roller of the array of first rollers between two adjacent second rollers of the array of second rollers.

6. The method according to claim 5, and further comprising:

connecting an electrical power source to the array of first rollers and connecting the array of second rollers to ground to create the difference in electrical potential; and positioning the array of first rollers further from walls of a chamber surrounding the rollers than the array of second rollers.

7. The method according to claim 1, wherein the substrate is permeable, and further comprising directing a flow of gas at the treatment zone, to blow gas through the permeable substrate when the substrate is positioned in the treatment zone.

\* \* \* \* \*